US012649968B2

(12) United States Patent
Stelzig et al.

(10) Patent No.: US 12,649,968 B2
(45) Date of Patent: Jun. 9, 2026

(54) MOLYBDENUM NITRIDE BASED MULTILAYER COATING FOR WEAR AND FRICTION REDUCTION

(71) Applicant: Oerlikon Surface Solutions AG, Pfäffikon, Pfäffikon (CH)

(72) Inventors: Timea Stelzig, Boppard (DE); Astrid Gies, Flaesch (CH); Juergen Becker, Geisenheim (DE)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 210 days.

(21) Appl. No.: 18/254,267

(22) PCT Filed: Nov. 30, 2021

(86) PCT No.: PCT/EP2021/083598
§ 371 (c)(1),
(2) Date: May 24, 2023

(87) PCT Pub. No.: WO2022/112605
PCT Pub. Date: Jun. 2, 2022

(65) Prior Publication Data
US 2024/0011145 A1 Jan. 11, 2024

Related U.S. Application Data

(60) Provisional application No. 63/119,187, filed on Nov. 30, 2020.

(51) Int. Cl.
*C23C 14/06* (2006.01)
*C23C 14/02* (2006.01)
*C23C 14/35* (2006.01)

(52) U.S. Cl.
CPC ........ *C23C 14/0641* (2013.01); *C23C 14/024* (2013.01); *C23C 14/352* (2013.01)

(58) Field of Classification Search
CPC ........... C04B 41/52–526; C04B 41/89; C04B 41/5062; C04B 45/5062; C23C 14/0641;
(Continued)

(56) References Cited

U.S. PATENT DOCUMENTS

2005/0170162 A1* 8/2005 Yamamoto ............ C23C 28/347
                                                          204/192.15
2006/0079090 A1* 4/2006 Elers ................. C23C 16/45534
                                                          438/653
(Continued)

FOREIGN PATENT DOCUMENTS

CN      110735120 A * 1/2020 ......... C23C 14/0641
EP        3074550 A2 10/2016
(Continued)

OTHER PUBLICATIONS

Machine translation of JP 2005/213637 A.*
(Continued)

*Primary Examiner* — Z. Jim Yang
(74) *Attorney, Agent, or Firm* — Chrisman Gallo Tochtrop LLC

(57) ABSTRACT

Method for the production of a Mo—N-based coating structure, including: providing a substrate to be coated and applying a hard material layer on the substrate, wherein the hard material layer includes at least one layer of Mo—N having a hexagonal crystal structure and at least one layer of Mo—N having a cubic crystal structure or a mixed hexagonal/cubic crystal structure, wherein the hard material layer is applied by a low temperature closed field unbalanced reactive magnetron sputtering coating process.

25 Claims, 3 Drawing Sheets

(58) Field of Classification Search

Figure 1:
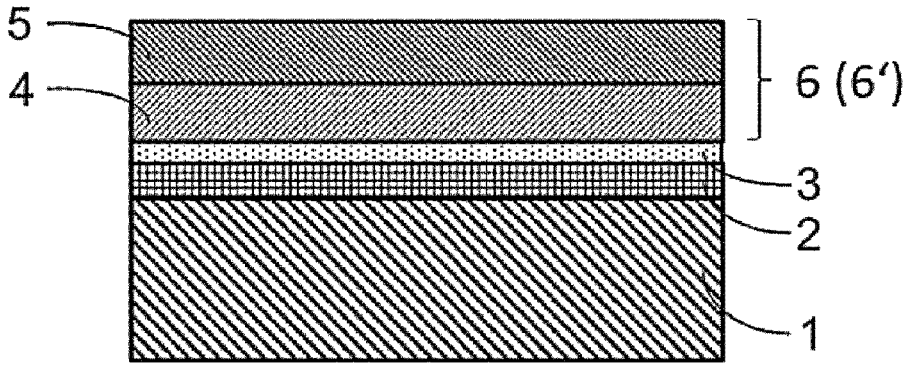

CPC ............ C23C 14/0638; C23C 14/0664; C23C 14/0676; C23C 16/34; C23C 16/347; C23C 16/36

See application file for complete search history.

(56) References Cited

U.S. PATENT DOCUMENTS

| | | | |
|---|---|---|---|
| 2012/0114436 A1* | 5/2012 | Andersson | C23C 30/005 |
| | | | 407/119 |
| 2013/0303414 A1* | 11/2013 | Ramm | C10M 103/06 |
| | | | 508/108 |
| 2015/0011444 A1* | 1/2015 | Ramm | C23C 14/0676 |
| | | | 204/192.16 |
| 2015/0023751 A1* | 1/2015 | Andersson | B23C 5/20 |
| | | | 148/222 |
| 2017/0037502 A1* | 2/2017 | Wang | C23C 28/042 |
| 2017/0211174 A1* | 7/2017 | Ramm | C23C 14/325 |
| 2018/0135164 A1* | 5/2018 | Karner | C23C 28/042 |
| 2019/0084052 A1* | 3/2019 | Katagiri | C23C 28/42 |
| 2019/0153584 A1* | 5/2019 | Karner | C23C 14/325 |

FOREIGN PATENT DOCUMENTS

| | | | | | |
|---|---|---|---|---|---|
| EP | 3074550 | B1 | * | 4/2018 | ......... C23C 14/0641 |
| JP | 2009101491 | A | * | 5/2009 | |
| KR | 101920869 | B1 | | 11/2018 | |
| WO | 2016/188632 | A1 | | 12/2016 | |

OTHER PUBLICATIONS

Machine translation of CN 110735120 A.*

Machine translation of JP 2009/101491 A.*

Hones et al., "Structural and mechanical properties of chromium nitride, molybdenum nitride, and tungsten nitride thin films", J. Phys. D: Appl. Phys. 36 (2003) 1023-1029.

Kubart et al., "Dynamic behaviour of the reactive sputtering process", Thin Solid Films 515 (2006) 421-424.

Pappacena et al., "Residual stresses, interfacial adhesion and tribological properties of MoN/Cu composite coatings", Wear 278-279 (2012) 62-70.

Pogrebnjak et al., "Superhard CrN/MoN coatings with multilayer architecture", Materials and Design 153 (2018) 47-59.

Wang et al., "Effect of nitrogen flow rate on structure and properties of MoNx coatings deposited by facing target sputtering", Journal of Alloys and Compounds, vol. 701 (Jan. 12, 2017), pp. 1-8.

Zhu et al., "Phase composition and tribological performance of molybdenum nitride coatings synthesized by IBAD", Surface & Coatings Technology 228 (2013) S184-S189.

International Search Report and Written Opinion of International Application No. PCT/EP2021/083598, dated Mar. 11, 2022, 20 pages.

* cited by examiner

Magnification 5x

Magnification 5x                                                                200 μm Magnification 5x                                                                200 μm

MOLYBDENUM NITRIDE BASED MULTILAYER COATING FOR WEAR AND FRICTION REDUCTION

The present invention relates to a method for producing a molybdenum nitride based multilayer coating as well as a device comprising a molybdenum nitride based multilayer coating, preferably produced by such a method.

Molybdenum nitride (Mo—N) coatings are of interest in tribological applications due to their wear resistance and friction reduction properties. Particular interest is in automotive applications. Molybdenum nitride with a hexagonal crystal structure ($\delta$-MoN) is particularly attractive, due to its superior properties with respect to wear and friction reduction and oxidation resistance.

STATE OF THE ART

Even though molybdenum nitride having a cubic crystal structure is considered inferior as reported by Zhu et al. in *Surface and Coating Technology* 223 (2013) 184-189, the majority of studies or inventions to date relate to the molybdenum nitride with a cubic crystal structure. Nevertheless, hexagonal molybdenum nitride based coatings produced by cathodic arc evaporation, also named arc PVD are described in detail elsewhere (WO2016188632A1, EP3074550B1). The most important teaching in the above-mentioned publications is that the use of arc PVD enables a high ionization and a high average (kinetic) energy of the metal ions coming from the target required for the deposition of molybdenum nitride with a hexagonal crystal structure. This technology allows the realization of hexagonal Mo—N at a relatively low process temperature meant to accommodate substrates typically applied in the automotive and components sector. However, the well-known disadvantage of arc PVD is the inevitable formation of macro-particles, so-called "droplets" in the coating. A post processing of the coating to remove the macro-particles is in this case mandatory to keep the counter-body wear low.

On the other hand, reactive magnetron sputtering is a coating process with attractive deposition rates without the disadvantageous formation of macro-particles. Unfortunately, the ionization is low, and the energy of the particles deposited on the substrates is relatively low. This leads typically to a reduced coating hardness and makes the coating less attractive for the considered application. The implementation of closed field unbalanced magnetron sputtering offers the possibility to transport large ion currents to the substrate. One of the main features of the unbalanced magnetron sputtering is to produce a magnetic field that is stronger at one of the poles which consequently extends the magnetic field lines further away from the target. This enables the generation of additional ions that facilitate the formation of a hexagonal molybdenum nitride coating onto the substrate. Additionally, the formation of fully dense coating structures at relatively low homologous temperatures can also be obtained that way.

So far, there are only few publications on molybdenum nitride coatings having a hexagonal crystal structure or at least having a hexagonal phase in a mixed crystal structure of Mo—N produced at temperatures below 220° C. and accordingly by reactive magnetron sputtering (Hones et al. *Journal of Physics D: Applied Physics,* 36(8) (2003) 1023-1029; Pappacena et al. Wear 62-70 (2013) 278-279). However, they are often limited by teaching only one type of Mo—N and/or the Mo—N coatings are combined with other type of coatings, such as W—N or Cr—N.

A typical phenomenon during reactive magnetron sputtering, independent of its type, is the so-called target poisoning as described by Kubart et al. *Thin Solid Films* 515 (2006) 421-424. Among other factors, its effect depends on the reactive gas amount introduced in the coating chamber. The development of the target voltage during a poisoning process gives valuable hints as to suitable working parameters for the generation of a desired transition metal nitride. The present invention makes use of the target poisoning phenomenon for the identification of the suitable working parameter that enables the deposition of molybdenum nitride having a hexagonal ($\delta$-MoN) and/or cubic ($\gamma$-Mo$_2$N) crystal structure.

Moreover, one of the common methods nowadays in modern material design is the creation of nanocomposite coatings including, for example, small nanograins of one phase embedded into a nanostructured phase of different composition or crystal structure. Such designs can significantly improve the properties of deposited coatings, such as for example their protective effectiveness. The advantages of such a design have been proven to be efficient for cubic ($\gamma$-MoN) molybdenum nitride in combination with chromium nitride via arc PVD processes as shown by Pogrebnjak et al. *Materials & Design* 153 (2018) 47-59. However, the present invention combines materials having different crystal structures not just by embedding each other into a nanocomposite, but by producing a multilayer architecture using a low temperature closed field unbalanced reactive magnetron sputtering coating process, wherein the thicknesses of the individual layers are controlled and the layers combined through different deposition parameters. This has been proven as being an effective tool to achieve synergistic protective effects of the produced coatings.

OBJECTIVE OF THE INVENTION

It is an object of the present invention to alleviate or to overcome one or more difficulties related to the prior art. In particular, it is an object of the invention to provide a coating structure as well as a method for producing the coating structure showing improved reduced wear and friction properties.

DESCRIPTION OF THE INVENTION

In order to overcome these problems, a method for the production of a Mo—N-based coating structure as well as a coating structure, preferably produced by such a method has been invented.

Thus, in a first aspect of the present invention disclosed is a method for the production of a Mo—N-based coating structure, comprising providing a substrate to be coated and applying a hard material layer on the substrate, wherein the hard material layer comprises at least one layer of Mo—N having a hexagonal crystal structure and at least one layer of Mo—N having a cubic crystal structure or a mixed hexagonal/cubic crystal structure, wherein the hard material layer is applied by a low temperature closed field unbalanced reactive magnetron sputtering coating process.

In the context of the invention, a layer with a hexagonal crystal structure means in particular a layer with a proportion of more than 90%, preferably more than 95%, most preferably 98%, hexagonal crystal structure. Accordingly, in the context of the invention, a layer with a cubic crystal structure can be understood to mean in particular a layer with a proportion of more than 90%, preferably more than 95%, most preferably 98%, cubic crystal structure. By a layer with mixed cubic and hexagonal crystal structure can be understood in the context of the invention in particular a layer with a proportion of at least 30%, preferably of at least 50% cubic crystal structure. In the context of the invention, a low temperature closed field unbalanced reactive magnetron sputtering coating process can in particular be understood as a process at a temperature of less than 250° C., preferably at a temperature of less than 200° C.

In another example of the first aspect, the at least one layer of Mo—N having a hexagonal crystal structure may be applied, before the at least one layer of Mo—N having a cubic crystal structure or a mixed hexagonal/cubic crystal structure may be applied on the layer of Mo—N having a hexagonal crystal structure.

With regard to a better adhesion of the hard layer to the substrate, an adhesion layer may be applied on the substrate, wherein the adhesion layer preferably may be applied between the substrate and the hard material layer, wherein the adhesion layer in particular may be applied directly on the substrate.

Likewise, in terms of better adhesion of the hard layer to the substrate, a support layer may be applied on the substrate, wherein the support layer preferably may be applied between the substrate and the hard material layer, wherein the support layer in particular may be applied directly on the adhesion layer.

For easy determination of suitable coating parameters, a target poisoning may be carried out in order to get suitable working parameters.

With regard to suitable coating temperatures, a process temperature lower than 250° C., preferably lower than 220° C., in particular lower than 180° C. may be used during the production. Such temperatures advantageously allow effective coating of even temperature-sensitive substrates.

In another example of the first aspect, the hard material layer may be applied as a double layer comprising one layer of Mo—N having a hexagonal crystal structure and one layer of Mo—N having a cubic crystal structure or a mixed hexagonal/cubic crystal structure.

In another example of the first aspect, at least two sputter cathodes may be used, preferably at least four cathodes may be used for applying the coating structure.

To enable a complete coating of differently formed substrates in a simple and flexible way, the substrate may be mounted on a 3fold-rotation tooling system during the coating process.

For the production of a pure and clean coating product, the substrate may be heated prior to the coating process to a temperature between 100 and 150° C., preferably between 110 and 140° C., in particular to 130° C.

Likewise, in terms of a production of a pure and clean coating product, the substrate may be cleaned prior to the coating process, wherein the cleaning preferably may comprise an etching, in particular an etching using argon-plasma.

In another example of the first aspect, the coating may be carried out in a protective gas atmosphere, wherein preferably argon may be used as protective gas, wherein argon may be used at a pressure of about 1 to 3.10-3 mbar.

In another example of the first aspect, a bias voltage of −120 V (m.f.) to −180 V (m.f.), preferably a bias voltage of −150 V (m.f.) may be used.

In another example of the first aspect, the at least one layer of Mo—N having a hexagonal crystal structure and the at least one layer of Mo—N having a cubic crystal structure or a mixed hexagonal/cubic crystal structure may be applied at different coating conditions, in particular at different nitrogen pressures.

With regard to a targeted setting of suitable coating parameters, the at least one layer of Mo—N having a hexagonal crystal structure may be applied at a nitrogen pressure of $2.3\text{-}5.0 \cdot 10^{-3}$ mbar and the layer of Mo—N having a cubic crystal structure or a mixed hexagonal/cubic crystal structure may be applied at a nitrogen pressure of $0.5\text{-}0.9 \cdot 10^{-3}$ mbar. Such coating parameters have proven to be advantageous for the purpose of producing a coating with improved reduced wear and friction properties.

In a second aspect of the present invention disclosed is a Mo—N-based coating structure, preferably producible by the previously described method, comprising a substrate and a hard material layer applied on the substrate, wherein the hard material layer comprises at least one layer of Mo—N having a hexagonal crystal structure and at least one layer of Mo—N having a cubic crystal structure or a mixed hexagonal/cubic crystal structure, In another example of the second aspect, the hard material layer may be formed as a double layer, comprising one layer of Mo—N having a hexagonal crystal structure and one layer of Mo—N having a cubic crystal structure or a mixed hexagonal/cubic crystal structure, wherein the thickness of the double layer preferably may be lower than 400 nm, more preferably lower than 300 nm, in particular lower than 180 nm.

In another example of the second aspect, the hard material layer may be formed as a multi-layer, comprising more than two layers, wherein the hard material layer preferably may comprise an alternating structure, comprising one layer of Mo—N having a hexagonal crystal structure and one layer of Mo—N having a cubic crystal structure or a mixed hexagonal/cubic crystal structure.

According to a preferred embodiment of the present invention the hard material layer may be formed as a multi-layer as mentioned directly above and having a bilayer period of maximal 200 nm, preferably lower than 200 nm. This means that the sum of the thickness of the layer of Mo—N having a hexagonal crystal structure and the thickness of the layer of Mo—N having a cubic crystal structure or a mixed hexagonal/cubic crystal structure may be lower than 200 nm, preferably lower than 150 nm.

With regard to a better adhesion of the hard layer to the substrate, the Mo—N based coating structure may comprise an adhesion layer, wherein the adhesion layer preferably may be located between the substrate and the hard material layer, in particular directly on the substrate.

Likewise, in terms of a better adhesion of the hard layer to the substrate, the Mo—N based coating structure may comprise a support layer, wherein the support layer preferably may be located between the substrate and the hard material layer, in particular directly on the adhesion layer.

With regard to suitable substrates, the substrate may be made of hardened steel, preferably 17Cr3/1.7016 steel.

With regard to an advantageous material selection for the adhesion layer and/or supporting layer, the adhesion layer and/or supporting layer may comprise a metal, preferably Mo or Cr, in particular the adhesion layer and/or supporting layer may be made of CrN or MoN or TiN or other metal nitrides that can be suitable as support layer.

In another example of the second aspect, the hard material layer may show an indentation hardness of >32.00+/−2.00 GPa, preferably an indentation hardness of >34.00+/−2.00 GPa measured according to DIN EN ISO 14577-4.

In another example of the second aspect, the hard material layer may show an abrasive wear below 6.00 $m^3 m^{-1} N^{-1} \cdot 10^{-15}$, preferably below 4.00 $m^3 m^{-1} N^{-1} \cdot 10^{-15}$ (measured by calowear abrasion tester).

The tribological behaviour under high load (200 N and 400 N respectively) and temperature ($T=150°$ C.) was evaluated in a reciprocating wear test, in a ball on component configuration (0W20 oil (Fuchs 0W20 EVO), 20 Hz frequency, 4.6 mm stroke length, $100Cr_6$ ball with a diameter of 10 mm as counter body).

The invention will now be described in more details based on examples and with the help of figures.

DETAILED DESCRIPTION OF THE INVENTION

Figure 2:
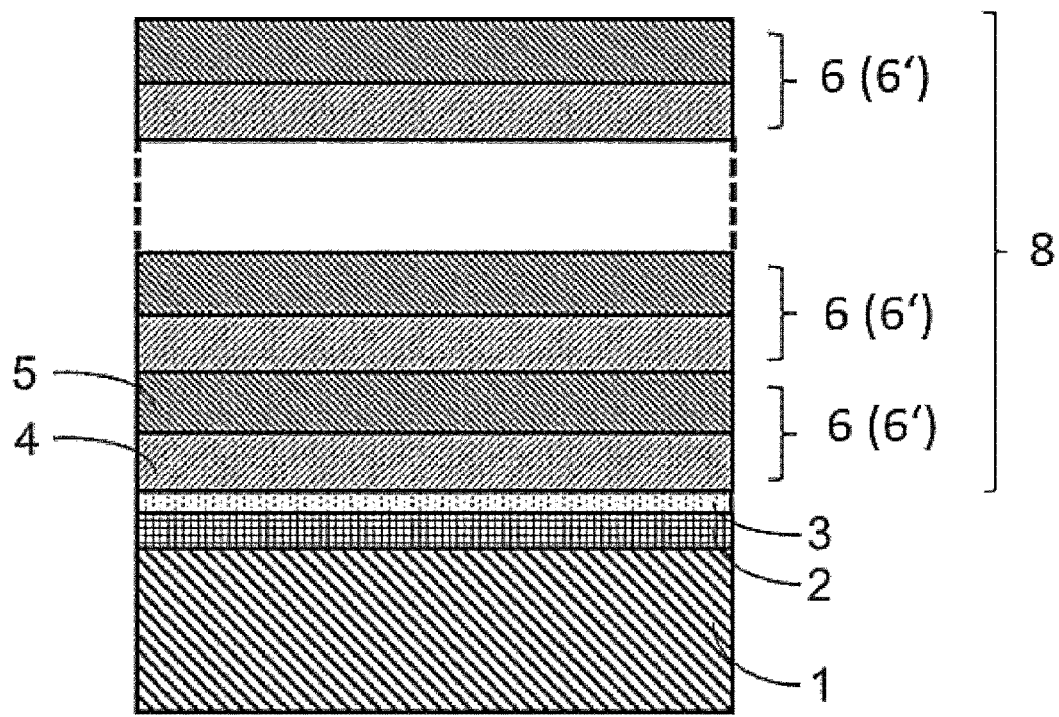
Figure 3:
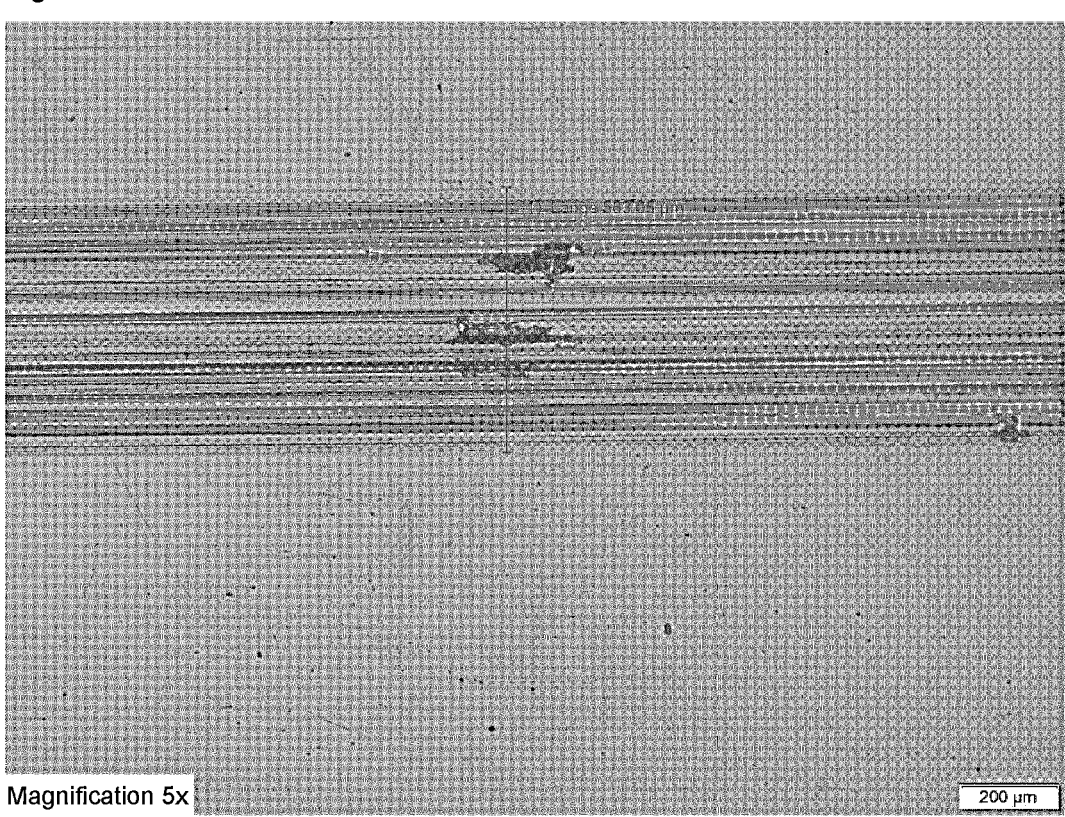
Figure 4:
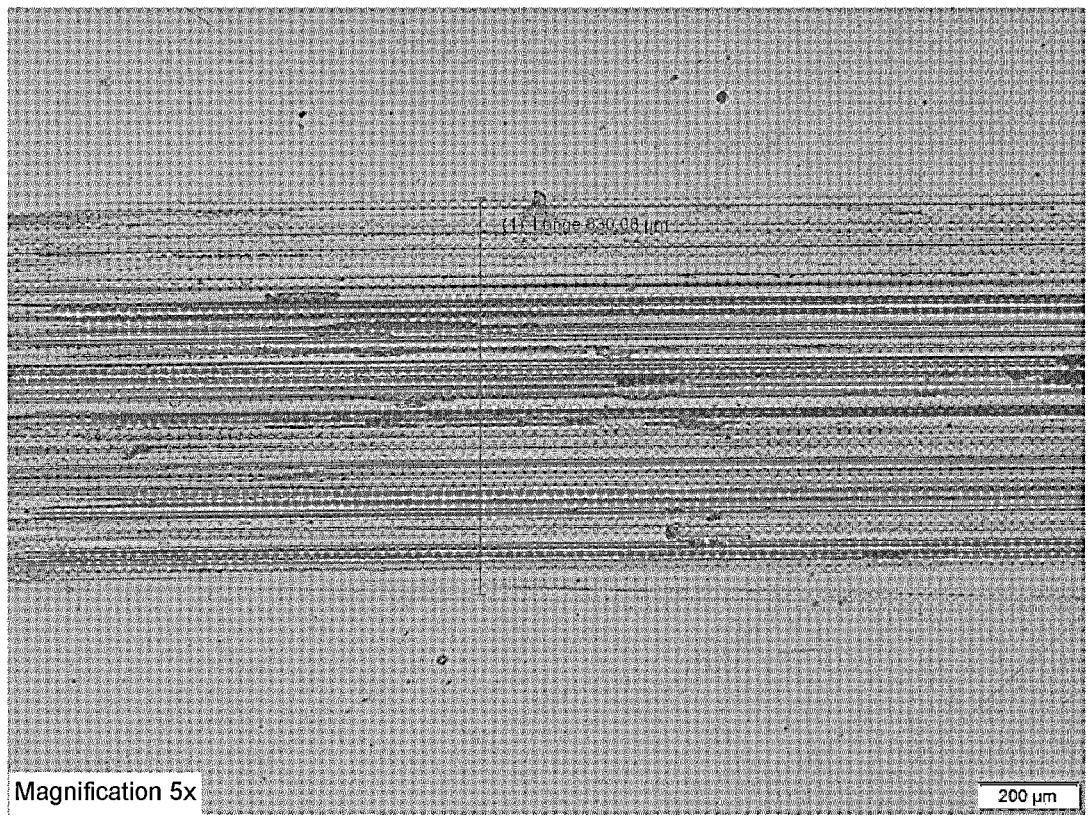
Figure 5:
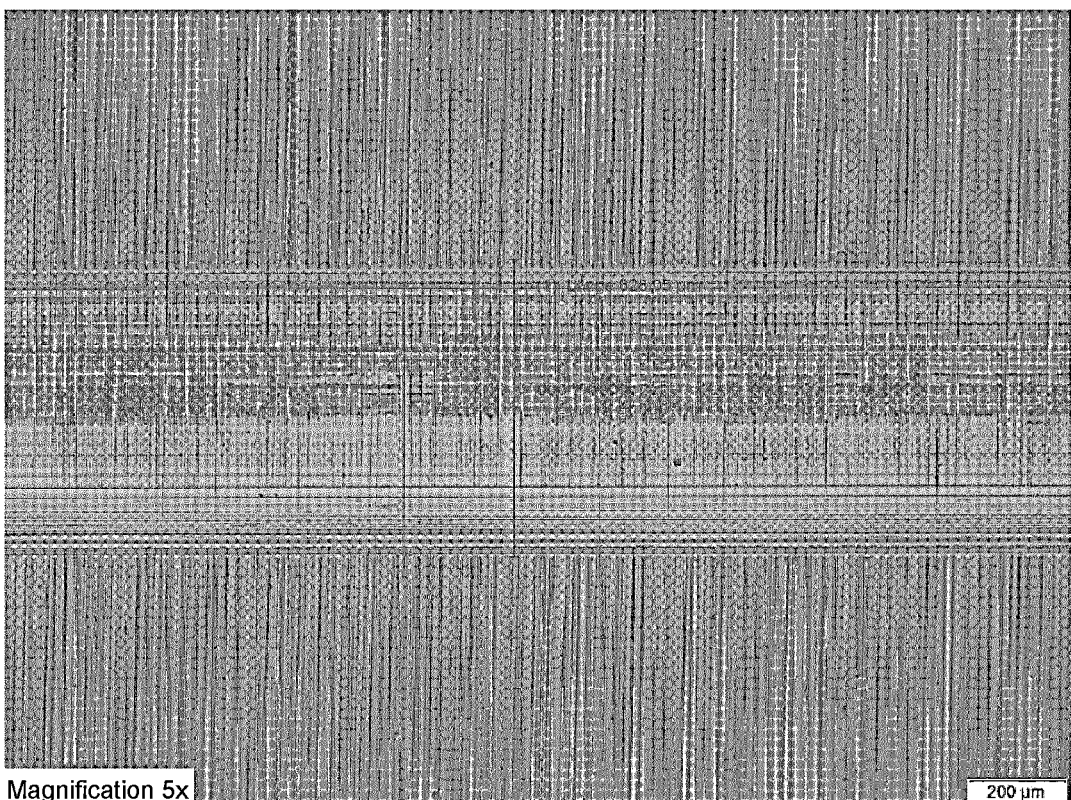

FIG. 1 shows a Mo—N-based coating structure according to the invention showing a dual layer structure, FIG. 2 shows a Mo—N-based coating structure according to the invention showing a multilayer structure, FIG. 3 shows the surface of a Mo—N-based coating structure according to the invention on a wear track on a sample after 3 hours (200N test), FIG. 4 shows the surface of a Mo—N-based coating structure according to the invention on a wear track on a sample after 3 hours (400 N test), FIG. 5 shows the surface of a Mo—N-based coating structure according to the invention on a wear track on a sample after 3 hours (400 N test).

The hexagonal molybdenum nitride based single and multi-layer coating systems are carried out using a PVD coating machine comprising at least two sputter cathodes, preferably four sputter cathodes, two of the four sputter cathodes being equipped with metallic Mo targets. The multilayer coating system is schematically illustrated on FIG. 1.

In some inventive examples:

The coatings are deposited on cylindrical steel substrates 1 made of case hardened steel of the type 17Cr3/ 1.7016—which are mounted on a 3fold-rotation tooling system. Hardened steel 17Cr3/1.7016 should not be understood as a limitation of the substrates that can be used according to the present invention but only as one example. Also other substrate materials, for example other hardened steel materials that are similar like 17Cr3/1.7016 can be considered suitable substrate materials temperature-sensitive materials in the context of the present invention. However, the substrate materials that can be used in the context of the present invention are not limited to hardened steel materials.

Prior to the coating, the substrates are heated up to temperatures between 100° C. and 150° C., preferably between 110° C. and 140° C., in particular 130° C. and etched using a pure Ar plasma, the Ar ions being extracted from a plasma beam, supported by an electron emitter.

The deposition of the hexagonal molybdenum nitride based coating system, such as, for example, an adhesion layer and a single phase molybdenum nitride layer, or only the single phase molybdenum nitride layer is carried out by means of closed field unbalanced magnetron sputtering from two metallic Mo targets.

The inventive coating systems comprises in some examples the following:

Adhesion layer 2: in order to ensure the adhesion of the following multilayer system onto the substrate 1, (however the adhesion layer is optional) such as a steel substrate, an adhesive layer 2 is deposited at a constant target power in a pure Ar atmosphere at a pressure range of $2.0 \cdot 10^{-3}$ mbar. The bias voltage is set to −150 V (m.f.). The material of the adhesion layer 2 can be metallic, for example molybdenum (Mo) or chromium (Cr) but most preferably Cr or a nitride, for example CrN or MoN.

Optionally, a support layer 3, for example CrN or MoN, or TiN, or other suitable transition metal nitride can be produced on top of the adhesion layer 2.

Hexagonal molybdenum nitride layer 4: a process window is defined at a target power of about 10 kW and an argon base pressure of $2.0 \cdot 10^{-3}$ mbar. A preferable nitrogen partial pressure between $2.3 \cdot 10^{-3}$ and $5.0 \cdot 10^{-3}$ mbar, more preferably between $2.8 \cdot 10^{-3}$ and $4.5 \cdot 10^{-3}$ mbar also allows the formation of hexagonal molybdenum nitride in the low energy regime of magnetron sputtering. Most preferably the present invention allows the formation of molybdenum nitride with a hexagonal crystal structure at a nitrogen partial pressure of $4.0 \cdot 10^{-3}$ mbar.

Cubic molybdenum nitride layer 5: under the same base conditions as for the previous Mo—N layer 4, a nitrogen partial pressure between $0.5 \cdot 10^{-3}$ mbar and $0.9 \cdot 10^{-3}$ mbar, preferably between $0.6 \cdot 10^{-3}$ and $0.8 \cdot 10^{-3}$ mbar enables the formation of single phase molybdenum nitride having a cubic crystal structure. Most preferably the present invention allows the formation of molybdenum nitride with a cubic crystal structure at a nitrogen partial pressure of $0.7 \cdot 10^{-3}$ mbar.

According to another preferred embodiment of the present invention, the deposition of the hexagonal molybdenum nitride based multilayer coating system is carried out by means of closed field unbalanced magnetron sputtering from at least two metallic Mo targets. The coating system is illustrated in FIG. 2. The coating system is deposited on cylindrical steel substrates 1 made of case hardened steel 17Cr3 which are mounted on a 3 fold-rotation tooling system.

Prior to the coating, the substrates 1 are heated up to temperatures between 100° C. and 150° C., preferably between 110° C. and 140° C., in particular 130° C. and etched using a pure Ar plasma, the Ar ions being extracted from a plasma beam, supported by an electron emitter.

The deposition of the molybdenum nitride multilayer based coating system, such as, for example, an adhesion layer 2 and an alternating coating of hexagonal single phase/cubic mixed 5 or single phase molybdenum nitride layers 4 is carried out by means of closed field unbalanced magnetron sputtering from two metallic Mo targets.

The coating system according to the present invention comprises the following:

Adhesion layer 2: in order to ensure the adhesion of the following multilayer system onto the substrate 1, such as a steel substrate, an adhesive layer 2 is deposited at a constant target power in a pure Ar atmosphere in a pressure range of $2.0 \cdot 10^{-3}$ mbar. The bias voltage is set to −150 V (m.f.). The material of the adhesion layer can be metallic, for example molybdenum (Mo) or chromium (Cr) but most preferably Cr or a nitride, for example CrN or MoN or TiN or other suitable adhesion layer material.

Optionally, a support layer 3, for example CrN or MoN or TiN or other suitable transition layer material can be produced on top of the adhesion layer 2.

Molybdenum nitride multilayer 8: a molybdenum nitride layer is deposited in an alternating way comprising at least a single-phase hexagonal layer 4 and a single-phase cubic molybdenum nitride layer 5 and/or a mixed-phase hexagonal/cubic molybdenum nitride layer 5. The layers 4, 5 are combined into a multilayer system 8. The multilayer coating system 8 comprises a variable number of at least one or more dual layers 6', each dual layer 6' comprising at least one Mo—N layer 4 having a hexagonal crystal structure and at least one layer MoN layer 5 having a cubic single phase or cubic/hexagonal mixed phase crystal structure, i.e. hexagonal Mo-N+cubic Mo—N or hexagonal Mo-N+ mixed hexagonal/cubic Mo—N. All dual layers 6' are deposited at a constant target power of 10 kW and a bias voltage applied onto the substrate with a pulse power supply which is set at about −150 V (m.f.). The deposition time for the bilayer is adjusted in such a way, that the thickness of the at least one dual layer 6' is preferably <400 nm, preferably <200 nm. Most preferably the present invention enables the deposition of a multilayer coating systems having improved protective properties when the total thickness of the at least one dual layer is below 180 nm.

The total coating thickness of the hexagonal MoN based multilayer coating system 8 can be adjusted by adjusting the number of deposited dual layers 6'.

The single layers, single phase hexagonal and cubic MoN coatings, show high indentation hardness of 29.00±2.00 GPa and 31.00±2.00 GPa, respectively. The herein reported MoN based multilayer systems 8 with an alternating hexagonal and cubic/mixed crystal structure have an indentation hardness of 35.00±2.00 GPa.

The single layers, single phase hexagonal and cubic MoN coatings, show a typical calo-wear of $7.00±1.00 \text{ m}^3\text{m}^{-1}\text{N}^{-1}\cdot10^{-15}$ and $10.00±1.00 \text{ m}^3\text{m}^{-1}\text{N}^{-1}\cdot10^{-15}$, respectively. Surprisingly, the herein reported MoN based multilayer systems 8 with an alternating hexagonal and cubic/mixed crystal structure have a calo-wear below $4.00 \text{ m}^3\text{m}^{-1}\text{N}^{-1}\cdot10^{-15}$.

Coated component parts without additional surface modification, for example piston pins of 26 mm diameter, have been tested under high load (200 N and 400 N respectively) and temperature (T=150° C.) applying 0W20 oil (Fuchs 0W20 EVO) in a reciprocating wear test in a ball on component configuration (20 Hz frequency, 4.6 mm stroke length, diameter $100\text{Cr}_6$ ball 10 mm). Post-test wear scar, volumetric loss and component surface film analyses were used to determine benefits of the herein reported coating systems. The single layer, single phase hexagonal molybdenum nitride coated component revealed already after the 200 N test small coating delamination in the wear track. This could be attributed to the generally known relatively high compressive stress attributed to the coating. FIG. 3 shows the delamination of the coating on the wear track on the sample after 3 hours.

The extent of these small local delamination is increased after the 400 N test. The calculated counter body wear volume here is $5.30\cdot10^{-3} \text{ mm}^3$. This is illustrated in FIG. 4 which shows the wear track on the sample after 3 hours but 400 N test.

On the other hand, the Mo—N based multilayer systems according to the present invention, having for example a dual layer thickness of 130 nm, shows no delamination in neither of the load classes tested. The tribological pair: coated component vs. $100\text{Cr}_6$ ball, applying a load of 400 N and a 0W20 commercial engine oil (Fuchs 0W20 EVO) yields a stable friction coefficient well below 0.05 [–]. The calculated counter body wear volume is below $2.00\cdot10^{-3}$ $\text{mm}^3$. This is illustrated by FIG. 5 showing no delamination on the wear track of the sample after 3 hours under 400 N load.

The invention claimed is:

1. A Mo—N-based coating structure, comprising:
a substrate, and
a hard material layer applied on the substrate, wherein the hard material layer comprises at least one layer of Mo—N having a hexagonal crystal structure and at least one layer of Mo—N having a cubic crystal structure or a mixed hexagonal/cubic crystal structure,
wherein the at least one layer of Mo—N having a hexagonal crystal structure has a proportion of more than 95% hexagonal crystal structure, and
wherein the at least one layer of Mo—N having a cubic crystal structure or a mixed hexagonal/cubic crystal structure has a proportion of more than 95% cubic crystal structure or 50% cubic crystal structure, respectively.

2. The Mo—N-based coating structure according to claim 1, wherein a thickness of the hard material layer is lower than 400 nm.

3. The Mo—N-based coating structure according to claim 1, wherein the hard material layer is formed as a multi-layer comprising more than two layers, wherein the hard material layer comprises an alternating structure, comprising one layer of Mo—N having a hexagonal crystal structure and one layer of Mo—N having a cubic crystal structure or a mixed hexagonal/cubic crystal structure.

4. The Mo—N-based coating structure according to claim 1, wherein the Mo—N based coating structure further comprises an adhesion layer, wherein the adhesion layer is located between the substrate and the hard material layer, and is located directly on the substrate.

5. The Mo—N-based coating structure according to claim 1, wherein the Mo—N based coating structure further comprises a support layer, wherein the support layer is located between the substrate and the hard material layer, and is located directly on an adhesion layer.

6. The Mo—N-based coating structure according to claim 3, wherein a sum of a thickness of the one layer of Mo—N having a hexagonal crystal structure and a thickness of the immediately adjacent one layer of Mo—N having a cubic crystal structure or a mixed hexagonal/cubic crystal structure is lower than 200 nm.

7. The Mo—N-based coating structure according to claim 1, wherein the substrate is made of hardened steel.

8. The Mo—N-based coating structure according to claim 5, wherein the adhesion layer and/or the supporting layer comprises Mo or Cr.

9. The Mo—N-based coating structure according to claim 1, wherein the hard material layer shows an indentation hardness of >32.00+/−2.00 GPa measured according to DIN EN ISO 14577-4.

10. The Mo—N-based coating structure according to claim 1, wherein the hard material layer shows a calo-wear below $6.00 \text{ m}^3\text{m}^{-1}\text{N}^{-1}\cdot10^{-15.}$ 11. A method for the production of the Mo—N-based coating structure of claim 1, comprising:
providing a substrate to be coated,
applying a hard material layer on the substrate, wherein the hard material layer comprises at least one layer of Mo—N having a hexagonal crystal structure and at least one layer of Mo—N having a cubic crystal structure or a mixed hexagonal/cubic crystal structure, wherein the hard material layer is applied by a low temperature closed field unbalanced reactive magnetron sputtering coating process.

12. The method according to claim 11, wherein at first the at least one layer of Mo—N having a hexagonal crystal structure is applied, before the at least one layer of Mo—N having a cubic crystal structure or a mixed hexagonal/cubic crystal structure is applied on the layer of Mo—N having a hexagonal crystal structure.

13. The method according to claim 11, wherein an adhesion layer is applied on the substrate, wherein the adhesion layer is applied between the substrate and the hard material layer and directly applied on the substrate.

14. The method according to claim 13, wherein a support layer is applied on the substrate, wherein the support layer is applied between the substrate and the hard material layer and directly on the adhesion layer.

15. The method according to claim 11, further comprising a target poisoning process in order to identify suitable working parameters.

16. The method according to claim 11, wherein a process temperature lower than 250° C. is used during the coating process.

17. The method according to claim 11, wherein the hard material layer is applied as a double layer comprising one layer of Mo—N having a hexagonal crystal structure and one layer of Mo—N having a cubic crystal structure or a mixed hexagonal/cubic crystal structure.

18. The method according to claim 11, wherein at least two sputter cathodes are used for applying the coating structure.

19. The method according to claim 11, wherein the substrate is mounted on a 3fold-rotation tooling system during the coating process.

20. The method according to claim 11, further comprising heating the substrate prior to the coating process to a temperature between 10° and 150° C.

21. The method according to claim 11, further comprising cleaning the substrate prior to the coating process, and wherein the cleaning comprises an etching.

22. The method according to claim 11, wherein the coating process is carried out in a protective gas atmosphere, wherein argon is used as a protective gas, and wherein argon is used at a pressure of 1 to $3 \cdot 10^{-3}$ mbar.

23. The method according to claim 11, wherein a bias voltage of −120 V (m.f.) to −180 V (m.f.) is used.

24. The method according to claim 11, wherein the at least one layer of Mo—N having a hexagonal crystal structure and the at least one layer of Mo—N having a cubic crystal structure or a mixed hexagonal/cubic crystal structure are applied at different nitrogen pressures.

25. The method according to claim 11, wherein the at least one layer of Mo—N having a hexagonal crystal structure is applied at a nitrogen pressure of $2.3\text{-}5.0 \cdot 10^{-3}$ mbar and the at least one layer of Mo—N having a cubic crystal structure or a mixed hexagonal/cubic crystal structure is applied at a nitrogen pressure of $0.5\text{-}0.9 \cdot 10^{-3}$ mbar.

* * * * *